(12) United States Patent
Steinbrecher

(10) Patent No.: US 6,364,761 B1
(45) Date of Patent: Apr. 2, 2002

(54) REDUNDANT COOLING SYSTEM FOR COMPUTER ASSEMBLY

(75) Inventor: Robin A. Steinbrecher, Olympia, WA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/596,840

(22) Filed: Jun. 19, 2000

(51) Int. Cl.[7] .................................................. H05K 5/00
(52) U.S. Cl. ........................................ 454/184; 361/695
(58) Field of Search ................................ 454/184, 252, 454/244, 249; 361/695

(56) References Cited

U.S. PATENT DOCUMENTS 2,431,726 A * 12/1947 Bechtler ...................... 454/252
4,829,882 A *  5/1989 Jackson ....................... 454/252

* cited by examiner

*Primary Examiner*—Jiping Lu
(74) *Attorney, Agent, or Firm*—Mark V. Seeley

(57) ABSTRACT

An improved cooling assembly is disclosed, which includes a chassis enclosing a duct. The duct has a first end and a second end. A first fan is positioned at the first end of the duct and a second fan is positioned at the second end of the duct. A fan failure vent is positioned along a first side of the duct between the first and second fans.

10 Claims, 3 Drawing Sheets

REDUNDANT COOLING SYSTEM FOR COMPUTER ASSEMBLY

FIELD OF THE INVENTION

The present invention relates to an apparatus for cooling components, e.g., semiconductors. More specifically, the invention relates to a cooling assembly that provides redundant cooling for high powered microprocessors.

BACKGROUND OF THE INVENTION

Because certain systems, e.g., servers, must minimize downtime, redundant features are often built into them. Redundancy enables the system to continue running, even when a defective component must be replaced. Such a system cannot continue to operate if the microprocessor cooling system fails. Consequently, such systems frequently rely upon redundant components to perform that cooling function.

Conventionally, heat is removed from microprocessors by placing a heat sink next to them, and forcing fan driven air across the heat sink. When redundant fans are included in a server to cool the microprocessor, or microprocessors, a first fan may drive air over the heat sink while a second fan draws air from the heat sink. If one fan fails, the remaining fan's speed may be increased to compensate for that failure, enabling the system to continue running until the defective fan can be replaced.

A problem may arise when one fan's failure serves to obstruct airflow that the other fan generates, such as may occur in systems that employ a series redundant cooling scheme. Consider, for example, the system 100 illustrated in FIG. 1a. System 100 includes chassis 120, which encloses duct 102. In normal operation, first fan 101 (i.e., the leading fan, which is positioned at first end 110 of duct 102—the inlet section of duct 102) forces air through duct 102 and over the device to be cooled, e.g., microprocessor 103. Second fan 104 (i.e., the trailing fan, which is positioned at second end 111 of duct 102—the exhaust section of duct 102) draws air through duct 102 from microprocessor 103. Airflow direction through duct 102, and over microprocessor 103, is indicated by arrows 112 and 113.

As shown in FIG. 1b, if first fan 101 fails, second fan 104 must carry the entire cooling load. In this particular design, however, defective first fan 101 obstructs airflow through duct 102, which may prevent second fan 104 from providing adequate cooling for microprocessor 103—even if second fan 104 significantly increases its speed. Similarly, as shown in FIG. 1c, if second fan 104 fails, it obstructs airflow through duct 102, which may prevent first fan 101 from providing adequate cooling for microprocessor 103—even if first fan 104 significantly increases its speed.

Accordingly, there is a need for an improved cooling assembly that provides redundant cooling. There is a need for such a system that ensures that the failure of one fan does not obstruct airflow generated by a second fan. The cooling assembly of the present invention provides such a system.

DETAILED DESCRIPTION OF THE PRESENT INVENTION

A cooling assembly is described. That assembly includes a chassis enclosing a duct. The duct has a first end and a second end. A first fan is positioned at the first end of the duct, and a second fan is positioned at the second end of the duct. The cooling assembly of the present invention also includes a fan failure vent that is positioned along a first side of the duct between the first and second fans. In the following description, numerous specific details are presented to provide a thorough understanding of the present invention. However, it will be apparent to those skilled in the art that the invention may be practiced in many ways other than those expressly described here. The invention is thus not limited by the specific details disclosed below.

Figure 1A:
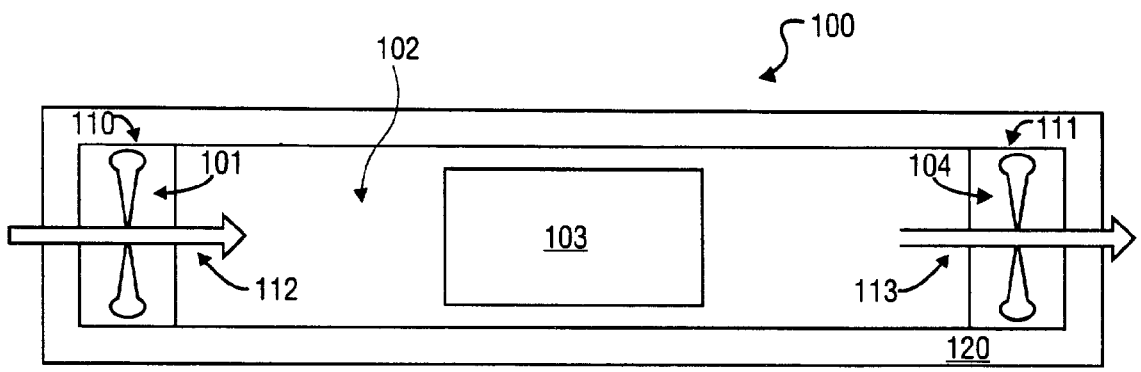
FIG. 1a represents an overhead view of a cooling assembly that provides redundant cooling.
Figure 1B:
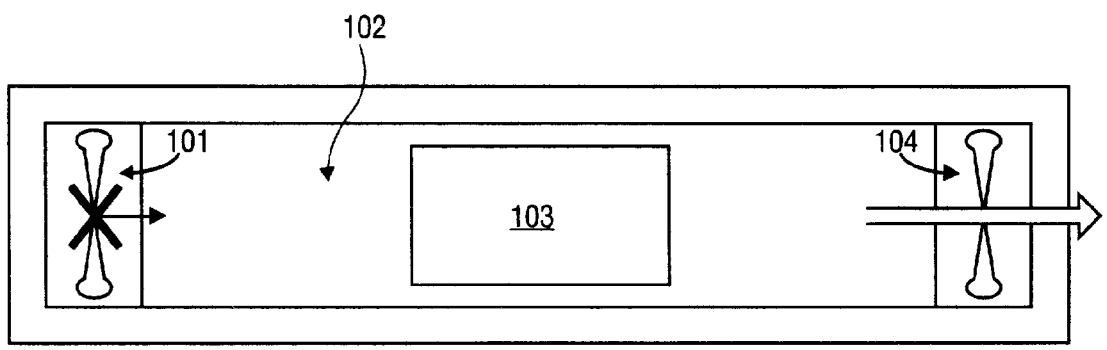
FIG. 1b represents the cooling assembly of FIG. 1a in which a leading fan has failed.
Figure 1C:
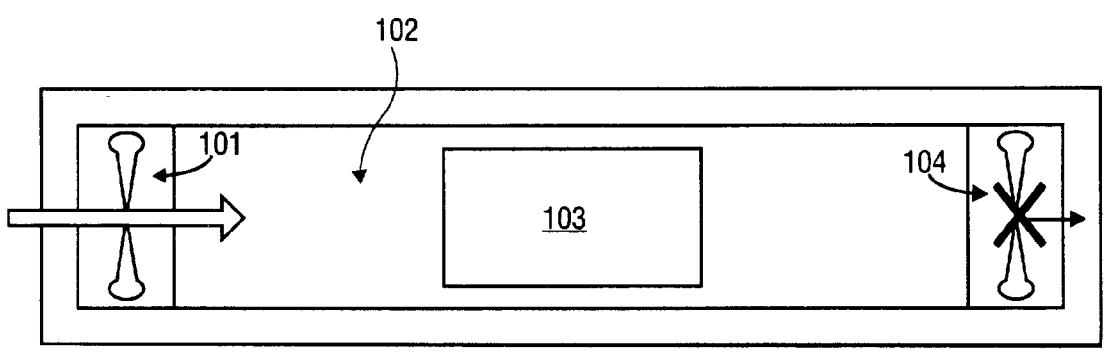
FIG. 1c represents the cooling assembly of FIG. 1a in which a trailing fan has failed.
Figure 2A:
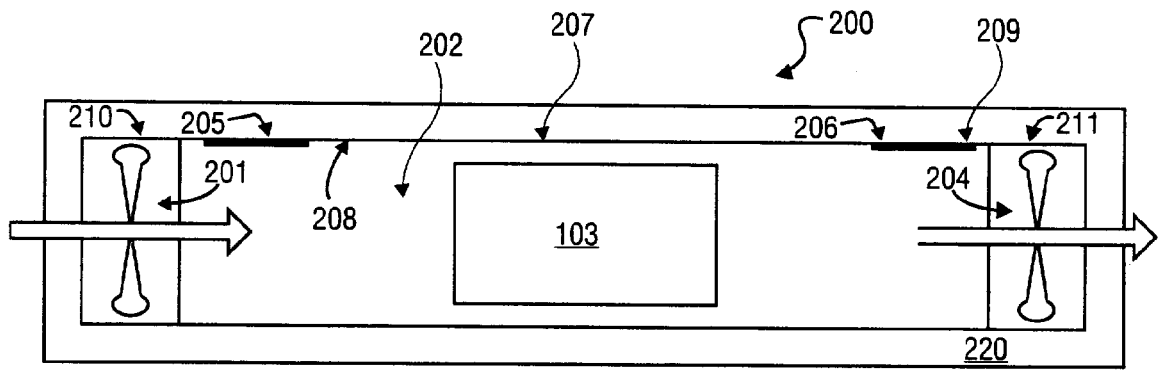
FIG. 2a represents an overhead cross-sectional view of a first embodiment of the computer system of the present invention, depicting normal operation.

The cooling system of the present invention may be used in a computer assembly. As shown in FIG. 2a, such a computer assembly 200 may comprise chassis 220, which encloses duct 202. Duct 202 is preferably positioned over a device to be cooled, e.g., a microprocessor or another type of semiconductor device. Duct 202 has a first end 210 and a second end 211. First fan 201 is positioned at first end 210 of duct 202, and second fan 204 is positioned at second end 211 of duct 202. In normal operation, fan 201 draws relatively cool air into the inlet section of duct 202, then forces it through the duct and over a device to be cooled, e.g., microprocessor 203. At the same time, fan 204 draws relatively warm air from inside duct 202, and expels it from the duct through its exhaust section.

In this embodiment, duct 202 includes a pair of fan failure vents, vents 205 and 206, which are positioned along side 207 of duct 202. In normal operation, vents 205 and 206 are each covered by a vent flap, which is coupled to a vent flap retainer. Each vent flap retainer is coupled to duct 202. In this embodiment, the retainer for the vent flap that covers vent 205 is coupled to inner surface 208 of duct 202 and the retainer for the vent flap that covers vent 206 is coupled to outer surface 209 of duct 202. Although FIG. 2a shows vents 205 and 206 positioned on the same side of duct 202, they could instead be located on opposite sides of the duct.

Figure 2B:
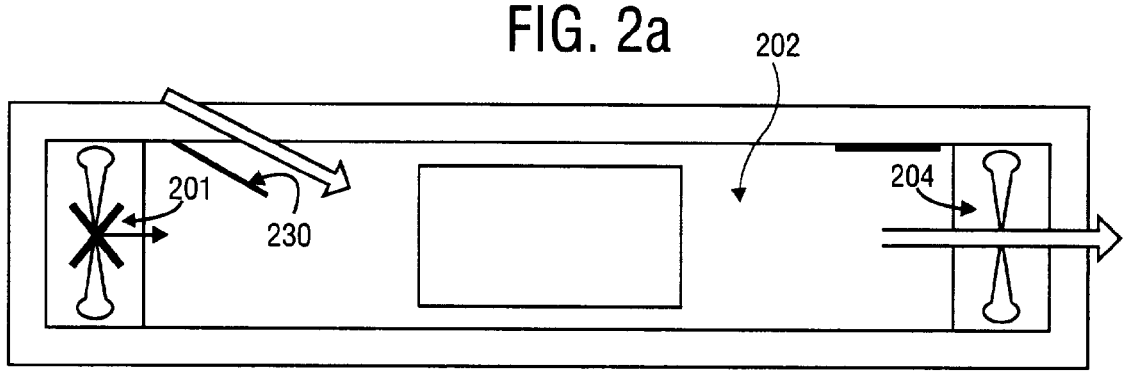
FIG. 2b represents an overhead cross-sectional view of a first embodiment of the computer system of the present invention, depicting operation after failure of the leading fan.
Figure 2C:
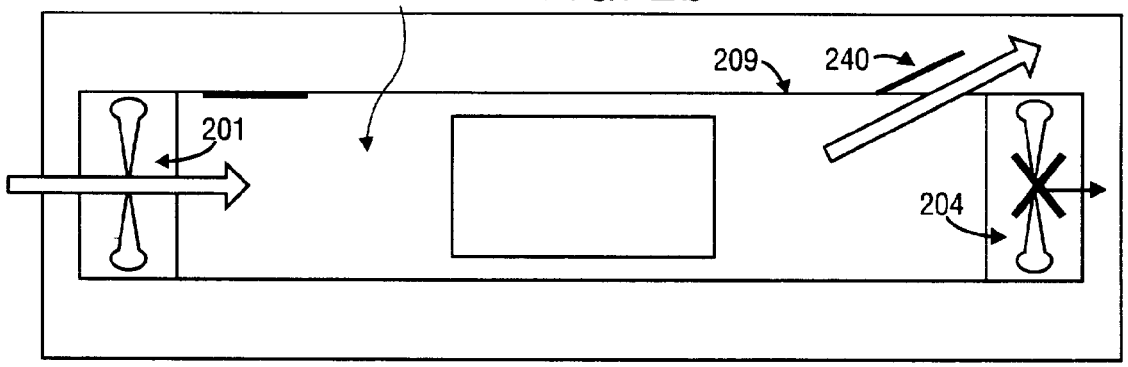
FIG. 2c represents an overhead cross-sectional view of a first embodiment of the computer system of the present invention, depicting operation after failure of the trailing fan.

FIGS. 2b and 2c illustrate how computer assembly 200 ensures that one fan's failure will not severely restrict airflow that the other fan generates. FIG. 2b illustrates how computer assembly 200 responds to the failure of the leading fan, i.e., fan 201. When fan 201 fails, the continued operation of fan 204 creates a pressure drop inside duct 202. As a consequence, the pressure applied to flap 230 from inside the duct will be less than the atmospheric pressure applied to flap 230 from outside the duct. This causes vent flap 230 to open, enabling air to be drawn into duct 202. (Flap 230 stays closed, of course, during normal operation, because air forced from fan 201 drives flap 230 up against inner surface 208 of duct 202. This causes the pressure applied to flap 230 from inside duct 202 to be greater than the atmospheric pressure applied from outside the duct, forcing flap 230 to seal against duct 202.)

FIG. 2c illustrates how computer assembly 200 responds to the failure of the trailing fan, i.e., fan 204. When fan 204 fails, vent flap 240 opens away from duct 202. This occurs because the continued operation of fan 201 causes the pressure applied to flap 240 from inside duct 202 to be greater than the atmospheric pressure applied from outside the duct. As a result, flap 240 opens, allowing air to escape from inside the duct. (Flap 240 stays closed during normal operation, when fan 204 draws air from duct 202. This creates a vacuum type effect, which causes the atmospheric pressure applied to flap 240 from outside duct 202 to be greater than the pressure applied from inside duct 202, forcing flap 240 to seal against outer surface 209 of duct 202.)

The present invention is particularly applicable to systems that include fans with stators that would otherwise severely restrict airflow when a fan fails. In this respect, the present invention should help facilitate use of five-bladed, seven-bladed and/or fixed-stator fans in redundant cooling systems. Such fans can deliver superior performance, when compared to that provided by the standard three-bladed fans, which are conventionally used for redundant system cooling. By facilitating their use, the cooling assembly of the present invention may enable superior cooling of high powered microprocessors, and other components, in redundantly cooled systems.

Fans 201 and 204 may be coupled to duct 202 in a conventional manner. Chassis 220 and duct 202 may be made from materials conventionally used to form such structures for use in computer assemblies.

By enabling airflow to be routed around a failed fan via a fan failure vent, the assembly shown in FIGS. 2a–2c is less susceptible to impeded airflow that may otherwise occur when either a leading or trailing fan fails. By reducing the impact that a fan failure may have on airflow through duct 202, such a design may facilitate an acceptable level of heat transfer to enable a system to keep running—at least long enough to enable the defective fan to be replaced.

Figure 3A:
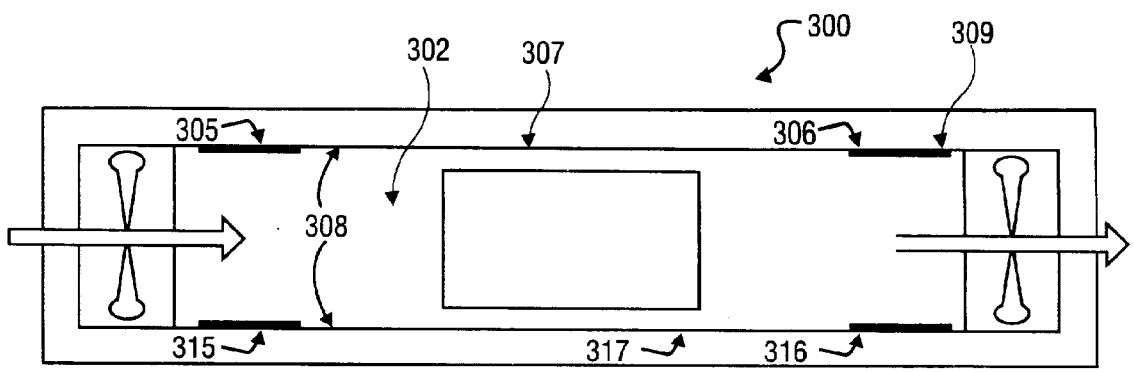
FIG. 3a represents an overhead cross-sectional view of a second embodiment of the computer system of the present invention, depicting normal operation.
Figure 3B:
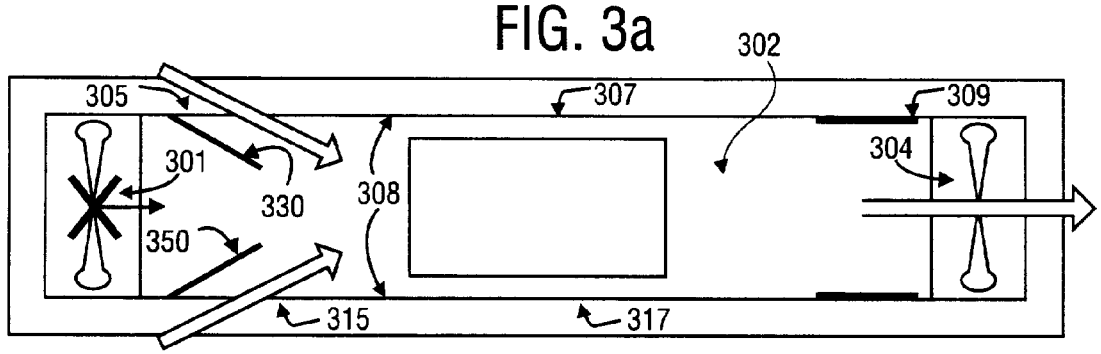
FIG. 3b represents an overhead cross-sectional view of a second embodiment of the computer system of the present invention, depicting operation after failure of the leading fan.
Figure 3C:
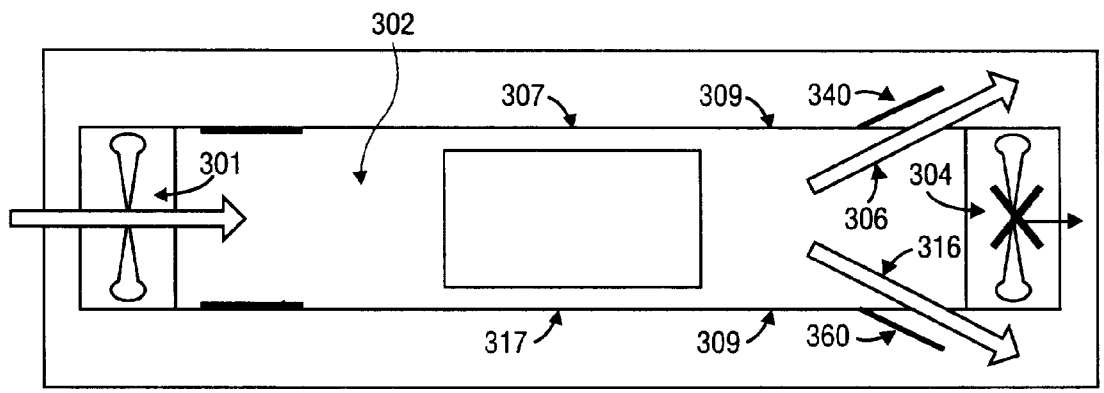
FIG. 3c represents an overhead cross-sectional view of a second embodiment of the computer system of the present invention, depicting operation after failure of the trailing fan.

FIGS. 3a–3c illustrate a second embodiment of the computer assembly of the present invention. In this embodiment, duct 302 includes a pair of fan failure vents, vents 305 and 306, which are positioned along first side 307 of duct 302, and a pair of fan failure vents, vents 315 and 316, which are positioned along second side 317 of duct 302. In normal operation, these vents are each covered by vent flaps, which are coupled to vent flap retainers. The vent flap retainers for the vent flaps that cover vents 305 and 315 are coupled to inner surface 308 of duct 302 and the retainers for the vent flaps that cover vents 306 and 316 are coupled to outer surface 309 of duct 302. In this embodiment of the present invention, fan failure vent 305 is positioned on first side 307 of duct 302 directly opposite fan failure vent 315, which is positioned on second side 317 of duct 302. Similarly, fan failure vent 306 is positioned on first side 307 of duct 302 directly opposite fan failure vent 316, which is positioned on second side 317 of duct 302.

FIGS. 3b and 3c illustrate how computer assembly 300 ensures that one fan's failure will not severely restrict airflow that the other fan generates. As is apparent from the drawings, essentially the same mechanism applies to the FIGS. 3a–3c embodiment as applies to the FIGS. 2a–2c embodiment—the difference being that two vent flaps open upon fan failure rather than a single vent flap. As FIG. 3b illustrates, air is drawn into duct 302 through fan failure vents 305 and 315, when first fan 301 fails while second fan 304 continues to operate. This results because of a pressure drop within duct 302 near fan failure vents 305 and 315 caused by the continued operation of fan 304. That pressure drop causes vent flaps 330 and 350 to separate from inner surface 308 of first and second sides 307 and 317 of duct 302, respectively, and to move toward the center of duct 302. As a result, fan failure vents 305 and 315 are opened.

As FIG. 3c illustrates, air is forced from duct 302 through fan failure vents 306 and 316, when second fan 304 fails while first fan 301 continues to operate. This results because of a pressure increase within duct 302 near fan failure vents 306 and 316, because fan 301 causes the pressure applied to those flaps from inside duct 302 to be greater than the atmospheric pressure applied from outside the duct. That pressure differential causes vent flaps 340 and 360 to separate from outer surface 309 of first and second sides 307 and 317 of duct 302, respectively, and move away from outer surface 309. As a result, fan failure vents 306 and 316 are opened.

Figure 4:
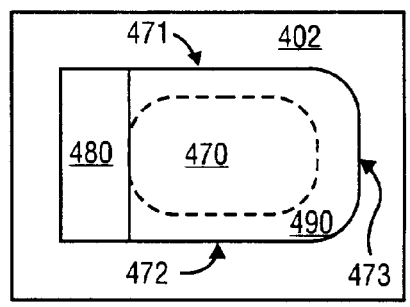
FIG. 4 represents a side view of a section of the computer systems of FIGS. 2a–2c and 3a–3c in the vicinity of a fan failure vent.

FIG. 4 represents a side view of a section of the computer systems of FIGS. 2a–2c and 3a–3c in the vicinity of a fan failure vent. Excised from duct 402 is fan failure vent 470—the boundary of which is defined by the dashed elliptical shape. Coupled to a side of duct 402 (this could be either an inner or outer side of duct 402, depending upon which way the vent flap will open) is vent flap retainer 480. Coupled to vent flap retainer 480 is vent flap 490. In this embodiment, the flap 490 can completely cover vent 470.

Vent flap retainer 480 may be made of any material that enables it to be fixed to duct 402 and to retain flap 490. Flap 490 may be made of any flexible, impermeable material, which enables flap 490 to easily open when subjected to the above described differential pressure. Preferred materials are organic polymers, such as polyesters. Particularly preferred are polyester materials like those that du Pont sells under the trademark Mylar®. In addition to coupling to retainer 480, flap 490 may attach to duct 402 along edges 471 and 472. Such a configuration allows flap 490 to open at edge 473 only, which may help prevent over-travel of the flap and air leakage through it. If edge 473 is not permitted much separation from duct 402, (i.e., substantially the entire length of edges 471 and 472 are attached to the duct), flap 490 may assume a bow like shape when opened. Alternatively, if those edges are attached to duct 402 over part of their lengths only, flap 490 may flex inwardly with a hinge like bending motion when opened. The particular shapes of vent 470, retainer 480, and flap 490 are not critical as long as they serve their respective functions.

An improved cooling assembly has been described. By adding one or more fan failure vents to a system that employs series redundant cooling, such a system may substantially reduce the airflow restriction that current series redundant cooling schemes must tolerate, when having to push or pull air through a failed fan. Because such a vent ensures relatively unrestricted airflow, systems that practice the present invention can continue providing adequate cooling for a time sufficient to enable replacement of a defective fan.

Features shown in the above referenced drawings are not intended to be drawn to scale, nor are they intended to be shown in precise positional relationship. Additional components that may be included in the illustrated computer assembly have been omitted as they are not useful to describe aspects of the present invention.

Although the foregoing description has specified a cooling assembly that includes certain features, those skilled in the art will appreciate that many modifications and substitutions may be made. For example, although the specific embodiments described above are presented in the context of a computer assembly, the present invention may be used in other types of systems that employ redundant series fan cooling, e.g., telecommunications equipment, power supplies, etc. . . . In addition, although those embodiments specify two or four vents, accompanied by their respective vent flaps and vent flap retainers, the number of vents may be varied from the number shown. Similarly, the number and type of fans may vary. Also, although the component to be cooled in the above embodiments is a microprocessor, the present invention may be used to cool other types of semiconductors or other types of devices.

Accordingly, it is intended that all such modifications, alterations, substitutions and additions be considered to fall within the spirit and scope of the invention as defined by the appended claims.

What is claimed is:

1. A cooling assembly comprising:
    a chassis enclosing a duct, the duct having a first end and a second end;
    a first fan positioned at the first end of the duct;
    a second fan positioned at the second end of the duct;
    a fan failure vent, which is positioned along a first side of the duct between the first and second fans; and
    a vent flap coupled to a vent flap retainer, the vent flap retainer coupled to the duct;
    wherein the flap is made from a flexible material that enables it to contact or separate from the first side of the duct, depending upon the pressure applied to the flap and the direction from which that pressure is applied.

2. The assembly of claim 1 further comprising a plurality of fan failure vents positioned along at least the first side of the duct.

3. The assembly of claim 1 wherein the flap is made from an organic polymer material.

4. The assembly of claim 3 wherein the flap completely covers the vent when the flap contacts the first side of the duct.

5. The assembly of claim 4 wherein the duct is positioned over a semiconductor device that requires cooling.

6. A computer assembly comprising:
    a chassis enclosing a duct, the duct having a first end and a second end;
    a first fan positioned at the first end of the duct;
    a second fan positioned at the second end of the duct;
    a first fan failure vent, which is positioned along a first side of the duct between the first and second fans;
    a second fan failure vent, which is positioned along the first side of the duct between the first and second fans;
    a third fan failure vent, which is positioned along a second side of the duct between the first and second fans, the third fan failure vent being positioned directly opposite the first fan failure vent;
    a fourth fan failure vent, which is positioned along the second side of the duct between the first and second fans, the fourth fan failure vent being positioned directly opposite the second fan failure vent;
    a first vent flap, for covering the first fan failure vent, that is coupled to a first vent flap retainer, the first vent flap retainer being coupled to an inner surface of the duct;
    a second vent flap, for covering the second fan failure vent, that is coupled to a second vent flap retainer, the second vent flap retainer being coupled to an outer surface of the duct;
    a third vent flap, for covering the third fan failure vent, that is coupled to a third vent flap retainer, the third vent flap retainer being coupled to an inner surface of the duct; and
    a fourth vent flap, for covering the fourth fan failure vent, that is coupled to a fourth vent flap retainer, the fourth vent flap retainer being coupled to an outer surface of the duct;
    wherein the first and third vent flaps open into the duct when pressure applied to them from inside the duct is less than pressure applied to them from outside the duct, and seal against the duct when pressure applied to them from inside the duct is greater than pressure applied to them from outside the duct.

7. The assembly of claim 6 wherein the second and fourth vent flaps open away from the duct when pressure applied to them from inside the duct is greater than pressure applied to them from outside the duct, and seal against the duct when pressure applied to them from inside the duct is less than pressure applied to them from outside the duct.

8. The assembly of claim 7 wherein the first and third fan failure vents are positioned between the first fan and the second and fourth fan failure vents, and wherein the second and fourth fan failure vents are positioned between the first and third fan failure vents and the second fan.

9. The assembly of claim 8 wherein air is drawn into the duct through the first and third fan failure vents, when the first fan fails while the second fan continues to operate, due to a pressure drop within the duct near the first and third fan failure vents, which causes the first and third vent flaps to separate from the inner surface of the first and second sides of the duct, respectively, and to move toward the center of the duct, thereby opening the first and third fan failure vents.

10. The assembly of claim 9 wherein air is forced from the duct through the second and fourth fan failure vents, when the second fan fails while the first fan continues to operate, due to a pressure increase within the duct near the second and fourth fan failure vents, which causes the second and fourth vent flaps to separate from the outer surface of the first and second sides of the duct, respectively, and move away from that outer surface, thereby opening the second and fourth fan failure vents.

* * * * *